(12) United States Patent
Spitzer (10) Patent No.: US 6,995,418 B2
(45) Date of Patent: Feb. 7, 2006

(54) INTEGRATED SEMICONDUCTOR STORAGE WITH AT LEAST A STORAGE CELL AND PROCEDURE

(75) Inventor: Andreas Spitzer, Ottobrunn (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/840,328

(22) Filed: May 7, 2004

(65) Prior Publication Data

US 2005/0041495 A1 Feb. 24, 2005

(30) Foreign Application Priority Data

May 9, 2003 (DE) ............................... 103 20 874

(51) Int. Cl.
*H01L 27/108* (2006.01)

(52) U.S. Cl. ...................................... 257/302; 438/241
(58) Field of Classification Search ........ 257/301–306, 257/311; 438/241–244
See application file for complete search history.

(56) References Cited

U.S. PATENT DOCUMENTS

| 5,214,603 A | * | 5/1993 | Dhong et al. ............... 365/207 |
| 5,576,637 A | | 11/1996 | Akaogi et al. |
| 5,889,304 A | | 3/1999 | Watanabe et al. |
| 5,953,246 A | | 9/1999 | Takashima et al. |
| 5,999,444 A | | 12/1999 | Fujiwara et al. |

OTHER PUBLICATIONS

S.M. Sze, "Physics of Semiconductor Devices", ISBN 0-471-09837-X, pp. 438-493, 1981, New York.

* cited by examiner

*Primary Examiner*—David Vu
(74) *Attorney, Agent, or Firm*—Edell, Shapiro & Finnan, LLC (57) ABSTRACT

The invention relates to an integrated semiconductor memory with at least one memory cell having at least one transistor which forms an inversion channel in the switched-on state. The transistor comprises a structure element having a first source/drain region, a second source/drain region and a region arranged between the first and the second source/drain region, the structure element is insulated from a semiconductor substrate by an insulation layer, a gate dielectric being arranged on the structure element and a word line being arranged on the gate dielectric.

19 Claims, 6 Drawing Sheets

INTEGRATED SEMICONDUCTOR STORAGE WITH AT LEAST A STORAGE CELL AND PROCEDURE

CROSS REFERENCE TO RELATED APPLICATIONS

This application claims priority under 35 USC §119 to German Application No. DE 103 20 874.7, filed on May 9, 2003, and titled "Integrated Semiconductor Storage with at Least a Storage Cell and Procedure," the entire contents of which are hereby incorporated by reference.

FIELD OF THE INVENTION

The invention relates to an integrated semiconductor memory with at least one memory cell having at least one transistor which forms an inversion channel in the switched-on state. The invention furthermore relates to a method for fabricating such an integrated semiconductor memory.

DESCRIPTION

Integrated semiconductor memories have a memory cell array with a multiplicity of memory cells for storing digital information as well as a logic area for accessing the memory cell array and for operating the semiconductor memory. Information storage is effected in storage capacitors, for example. The storage capacitors are accessed via a selection transistor arranged at the crossover location between a word line and a bit line. The selection transistor is opened or closed by means of the word line.

In the logic area transistors are contained, for example, in decoders, sense amplifiers, switches or drivers. These transistors do not serve for selecting an individual memory cell and are therefore dimensioned differently than the selection transistors of memory cells. The transistors in the memory area are dimensioned such that, inter alia as much wafer area as possible is saved in the memory area. The transistors in the logic area are dimensioned such that the desired switching behavior is achieved.

One conceivable design of the transistor in the memory area is the surrounding gate transistor, in which structure elements formed by means of a vertical, anisotropic etching, namely ridges, are used as a basic structure for the formation of the transistor. In this case, the patterned, usually elongated ridge is covered with a gate dielectric and a surrounding gate electrode formed on the side faces of the ridge, with the aid of the spacer technique. A trench capacitor is arranged at one end of the ridge. A first, lower source/drain region is formed by outdiffusion from the inner capacitor electrode of said trench capacitor. A second, upper source/drain region is formed by means of implantation on the top side of the ridge. In this way, a vertical selection transistor is fabricated at said one lateral end of the ridge at which the trench capacitor is situated.

In publications, however, vertical selection transistors are described more frequently. In trenches extending deep into the semiconductor substrate and containing trench capacitors, they are situated at a smaller trench depth above the trench capacitors.

Transistors are usually fabricated as field-effect transistors. A field-effect transistor comprises two source/drain regions. Between the two source/drain regions, in the on state of the transistor, an electrically conductive channel is formed by inversion of doped semiconductor material. The source/drain regions and the semiconductor region in which the inversion channel is formed are insulated from a gate electrode by a gate dielectric. The inversion channel has an effective channel length between source and drain which essentially corresponds to the lithographic resolution limit used.

As a result of the miniaturization of semiconductor memories, ever smaller dimensions of memory cells are being chosen and ever smaller operating voltages are being applied. However, since the maximally compatible current density in a memory cell is limited, there is the problem that the writing and reading speed of semiconductor memories cannot always be increased to the extent desired.

In particular leakage currents, which flow, into the substrate during the off-state of the transistor cause an early discharge of stored charges. Further leakage currents flow through the material of the semiconductor substrate. Mainly in the case of dynamic semiconductor memories, the occurring leakage currents shorten the refresh period and increase the current consumption of the semiconductor memory.

Employing conventional transistors in which the channel region is electrically insulated from the semiconductor substrate by an insulation layer, during the switched-off state of the transistor in which the transistor is non-conducting, the majority charge carriers in the channel region cannot run off, neither through the insulation layer nor through the pn junctions to source and drain. The majority charge carriers therefore accumulate and ultimately lead to leakage currents between the storage capacitor and the bit line. Such a leakage current also occurs in case of a selection transistor with a channel region which has no substrate contact and whose electrical potential is variable ("floating body").

SUMMARY

An aspect of the present invention is to provide an integrated semiconductor memory with a memory cell having a selection transistor in which the smallest possible leakage currents occur. In particular, leakage currents which could arise between the first and the second source/drain region due to parasitic effects shall be prevented in the off state of the selection transistor.

This is achieved according to an embodiment of the present invention by means of an integrated semiconductor memory device. Accordingly, provision is made of at least one memory cell having at least one transistor which forms an inversion channel in the switched-on state, the transistor comprising a structure element containing a semiconductor material. The structure element comprising a first source/drain region, a second source/drain region and a region arranged between the first and the second source/drain region. The structure element being insulated from a semiconductor substrate by an insulation layer, a gate dielectric arranged on the structure element and a word line arranged on the gate dielectric. The gate dielectric including a high-resistance tunnel contact having a first region, the layer thickness of which is so small that, in the switched-off state of the transistor, majority charge carriers generated thermally in the structure element pass into the word line by direct tunneling through the gate dielectric. Additionally, the entire region of the structure element which region is arranged between the first and the second source/drain region being depleted of majority charge carriers in the switched-on state of the transistor.

By virtue of the high-resistance tunnel contact, charge carriers arising in the off state, namely majority charge carriers which normally would contribute to leakage currents between the first and the second source/drain region and thus between the storage capacitor and the bit line, can run off into the word line. The tunneling current conducts majority charge carriers from the substrate region of the structure element but does not alter the quantity of charges in the storage capacitor.

Conventionally, the gate dielectric serves for electrical insulation between the channel region and the gate electrode and is optimized with regard to its insulation ability. According to the invention, the gate dielectric is also used as a tunnel layer enabling direct tunneling from the structure element into the word line. In case of direct tunneling, the probability of the presence of the tunneling-through charge carriers in the gate dielectric is equal to zero. Direct tunneling occurs in dielectric layers having layer thicknesses of less than 5 nm. By contrast, in the case of dielectric layers having layer thicknesses greater than 5 nm, which are provided in floating gate transistors, Fowler-Nordheim tunneling occurs.

The first region of the gate dielectric, whose layer thickness is so small that direct tunneling occurs in the off state of the transistor, may cover a plurality of outer surfaces of the structure element. As an alternative, the first region of the gate dielectric may cover exactly a single outer surface of the structure element, for example a top side of the structure element, the top side being opposed to the insulation layer.

In case of semiconductor substrates having a buried insulation layer, majority charge carriers that accumulate in the structure element cannot be conducted away through a substrate contact. According to an embodiment of the present invention, the majority charge carriers are therefore conducted away into the word line through the first region of the gate dielectric.

It is preferably provided that a plurality of memory cells are connected to the word line. A word line is a conductor line which controls many memory cells. A word line can conduct away charge carriers. In contrast to a word line, a floating gate electrode of a floating gate transistor does not extend over a plurality of memory cells, but rather is allocated only to a single memory cell. Moreover, the purpose of a floating gate is to store charge carriers, rather than to conduct them away.

It is preferably provided that the structure element is arranged on an insulation layer, the first source/drain region is arranged in the structure element at one lateral end of the structure element and the second source/drain region is arranged in the structure element at another lateral end of the structure element, and between the two ends of the structure element, a top side of the structure element, said top side being opposed to the insulation layer, and side faces of the structure element which adjoin the top side are covered with an arrangement of layers comprising a gate dielectric and a gate electrode.

In this case, the selection transistor is completely situated above the buried insulation layer. The insulation layer preferably is an oxide layer. All selection transistors of the semiconductor memory are arranged on the buried insulation layer and are insulated from one another by the insulation layer. Therefore shallow trench isolations are not necessary. The current flow direction of the transistor channel runs parallel to the insulation layer. The current flow direction furthermore is parallel to a direction of main extension of the structure element. The arrangement of layers comprising the gate dielectric and a gate electrode covers a plurality of surfaces of the structure element. The arrangement of layers covers, for example, a top side of the structure element, the top side being arranged opposed to the insulation layer, and side faces of the structure element which extend from the insulation layer to the top side of the structure element, the top side being opposed to the insulation layer. The side faces therefore adjoin both the top side of the structure element and the insulation layer. Thereby a significantly larger electrically effective channel width than in conventional selection transistors is achieved, since twice the dimension of the structure element in the direction perpendicular to the insulation layer (i.e. twice the height of the structure element) and the width of the structure element perpendicular to the current flow direction together constitute the channel width. Therefore, by means of a large height of the structure element, high channel width are achievable without enlarging the basic area of the memory cell. As a result, higher currents for storing and reading out information are achievable, so that the writing and reading speed of the semiconductor memory increases.

Consequently, the conflicting requirements made of the transistor properties and of the retention behavior can be better reconciled with one another than in the case of a conventional semiconductor memory.

Moreover, the invention's tunnel contact leading to the word line allows thermally generated charge carriers to run off from the structure element without a leakage current contribution. By contrast, in conventional semiconductor memories in which the structure elements are isolated from the semiconductor substrate by the insulation layer, thermally generated charges can run off from the structure element only via the two source/drain regions. This results in leakage currents which alter the quantity of charges stored in the storage capacitor.

It is preferably provided that the gate dielectric has a second region, which has a layer thickness greater than the layer thickness of the first region. Preferably, the layer thickness of the first region is less than 3 nm and the layer thickness of the second region is greater than 3 nm. Preferably, only a small partial region of the surface of the structure element is covered with the first region of the gate dielectric usable as a tunnel contact, since the gate dielectric is intended to effect electrical insulation in the on state of the selection transistor. In any event, due to the small magnitude of eventual tunneling currents only small surface regions of the gate dielectric are required in order to carry off said tunneling currents.

A preferred embodiment provides for the first region of the gate dielectric to be arranged on a top side of the structure element, the top side being opposed to the insulation layer. The second region comprises the side faces of the structure element. The gate dielectric is embodied in the form of a bird's beak at the two lateral ends of the structure element. The bird's beak is formed after the gate patterning by means of an oxidation step and covers the first and the second source/drain region. The bird's beak is a thick dielectric layer which, in the off state of the transistor, effectively reduces tunneling currents between the gate electrode and the inner capacitor electrode.

In terms of production engineering, it is possible to fabricate two different layer thicknesses of the gate dielectric by introducing, and preferably implanting nitrogen into the structure element. Accordingly, it is provided that a nitrogen dopant is introduced into the structure element in a manner adjoining the first region of the gate dielectric, for example directly under the top side of the structure element, the top side being opposed to the insulation layer. The nitrogen dopant reduces the growth rate of the gate oxide on the surface of the structure element. Thereby the first and second regions of the gate dielectric each having different layer thicknesses can be fabricated simultaneously without the need for etching-back steps or masking steps for the thinner, first region.

It is preferably provided that the gate dielectric has a layer thickness of approximately less than 3 nm, preferably on the order of between 2 and 3 nm, in the first region. In the second region, the gate dielectric has a layer thickness of between approximately 4 and 8 nm, for example. A layer thickness difference of at least on the order of 0.5 nm, even better 1 nm, is advantageous in any event.

It is preferably provided that the memory cell is a dynamic memory cell and the transistor is a selection transistor, and that the memory cell has a storage capacitor, which is electrically connected to the first source/drain region. As an alternative, it is possible also in the case of static semiconductor memories such as, for instance, SRAMs (static RAM), whose memory cells are formed without storage capacitors, for all or some of the transistors to be provided with a tunnel window according to the invention in the gate oxide.

It is preferably provided that the storage capacitor is a trench capacitor having an inner capacitor electrode, an outer capacitor electrode and a capacitor dielectric, and, on the bottom side of the insulation layer, the distance between the inner capacitor electrode and the outer capacitor electrode is of exactly the same magnitude as at a bottom of the trench capacitor.

In conventional trench capacitors, a collar region, i.e. a thick dielectric layer, is provided in an upper part of the capacitor trench on the trench inner wall. The inner capacitor electrode is electrically insulated from the substrate region of the selection transistor by the collar region. This prevents the formation of parasitic transistors. The collar region leads to constrictions for the inner capacitor electrode at the bottom side of the insulation layer. The distance between the inner and outer capacitor electrodes is increased. As a result, the capacitance of the storage capacitor is reduced. In the case of the preferred embodiment without a collar region, by contrast, this disadvantage is obviated. The formation of parasitic transistors is prevented by the buried insulation layer and a collar region is no longer necessary. The distance between the inner and outer capacitor electrodes only resulting from the capacitor dielectric and is very small over the entire extent of the capacitor between the bottom of the capacitor and the insulation layer, as a result of which the capacitance is increased.

It is preferably provided that the inner capacitor electrode extends to the bottom side of the buried insulation layer and is connected by a contact to the first source/drain region of the selection transistor. The capacitor dielectric extends up to the bottom side of the insulation layer to the bottom of the storage capacitor. The bottom side of the insulation layer is that boundary surface of the insulation layer which adjoins the semiconductor substrate. That boundary surface of the insulation layer which adjoins the structure elements is the top side of said insulation layer. The contact extends from the bottom side of the buried insulation layer to a region above the insulation layer. The contact is electrically insulated from the substrate material of the semiconductor substrate by the insulation layer. Consequently, leakage currents between a storage capacitor and a selection transistor can hardly occur in this region.

It is preferably provided that a top side of the contact, wherein the top side is arranged on the same side of the insulation layer as the structure element, the contact is arranged nearer to the buried insulation layer than the top side of the structure element, and that the contact is insulated from a further word line by an insulating upper filling structure. The further word line (passing word line) runs across the trench capacitor, but does not control the selection transistor of the memory cell containing said trench capacitor. The passing word line is insulated from the top side of the contact by the upper filling structure.

It is preferably provided that the semiconductor substrate is doped below the buried insulation layer.

It is preferably provided that a bit line contact is in contact with an end face of the structure element. The bit line contact preferably adjoins an end face of the structure element which extends from the insulation layer to the top side of the structure element, said top side being opposed to the insulation layer. The bit line contact touches the entire end face, so that the end face forms a common interface of the structure element and the bit line contact. The end face of the structure element furthermore extends to a spacer adjoining the word line. With the aid of the word line spacer, that lateral end of the structure element which is arranged remote from the capacitor can be patterned without an additional etching mask. Consequently, the lateral end of the structure element terminates with an outer surface of the spacer. That end face of the structure element which is arranged at this end is connected by a bit line contact to a bit line running above the structure element.

It is preferably provided that a spacer is arranged beside the word line, said spacer having an outer surface arranged flush with a lateral end of the structure element. The spacer covers a side wall of the word line and has an outer surface opposed to the side wall and further has a bottom side which extends from the side wall of the word line to the outer surface of the spacer. The bottom side of the spacer is arranged on the structure element. A lower region of the outer surface of the spacer is arranged flush with the lateral end of the structure element in the lateral direction, i.e. in the direction of main extension of the structure element. The lower region of the outer surface of the spacer has the same lateral position as the lateral end of the structure element.

It is provided that a bit line is arranged above the structure element, which bit line runs in the direction of main extension of the structure element and is connected to the second source/drain region. A multiplicity of bit line contacts, each adjoining an end face of a respective structure element, are connected to the bit line. Word lines and bit lines are electrically insulated from one another by dielectric layers and fillings, which contain oxides or nitrides, for example.

It is preferably provided that the arrangement of layers comprising the gate dielectric and the gate electrode covers the top side of the structure element being opposed to the insulation layer, and the side faces of the structure element which adjoin the top side. The word line thus forms the gate electrode on the top side of the structure element and on adjoining side faces of the structure element and is there separated from the semiconductor material of the structure element only by the gate oxide layer. The effective channel width is therefore larger than the width of the top side of the structure element measured perpendicularly to the direction of main extension of the structure element. The structure element may also be patterned in a manner narrower than the optical resolution limit. The channel width is not adversely influenced thereby, since essentially the height of the structure element contributes to the channel width.

Preferably, the semiconductor memory has a multiplicity of memory cells with transistors, a bit line contact being arranged only at every second crossover between a bit line and a word line and a word line passing above or below a storage capacitor at the remaining crossovers.

It is preferably provided that the structure element is formed in parallelepipedal fashion. Such a structure element has a rectangular, preferably elongate basic area and is also referred to as a ridge. The length of that region of the structure element which is arranged between the source/drain regions and determines the effective channel length of the transistor channel, is at least on the order of two times, preferably more than approximately two and a half times, the ridge width measured in the direction of the word line course. The ridge in particular has such a geometry which ensures that the selection transistor is a fully depleted device. In case of a fully depleted device, the entire region of the structure element which is arranged between the two source/drain regions is fully depleted of majority charge carriers in the on-state of the transistor. This region is also referred to as a "transistor body".

The aspect on which the invention is based is furthermore achieved by means of a method having the following steps:
a) providing a semiconductor substrate having a buried insulation layer and a layer made of semiconductor material on the insulation layer,
b) patterning the layer made of semiconductor material to form structure elements separated from one another,
c) forming a gate dielectric on the surface of a structure element,
d) depositing at least one gate layer,
e) forming a word line by patterning the at least one gate layer, and
f) completing a transistor by forming a first and a second source/drain region into the structure element at opposed ends of the structure element, in step c) at least one first region of the gate dielectric being formed, and the formation of the first region of the gate dielectric being terminated at a point in time at which the first region of the gate dielectric has a layer thickness which is so small that, in the switched-off state of the transistor, majority charge carriers generated thermally in the structure element pass into the word line by direct tunneling through the gate dielectric.

According to an embodiment of the present invention, in step c), a gate dielectric is formed which can be utilized not only as electrical insulation between the structure element and the word line in the switched-on state of the transistor, but also as a high-resistance tunnel contact in the switched-off state of the transistor. For this purpose, the gate dielectric is grown, at least on a part of the surface of the structure element, with a small layer thickness which is between on the order of 2 and 3 nm, for example, but is in any event less than approximately 3 nm. This layer thickness corresponds to the final layer thickness of the gate dielectric in the first region. The gate dielectric is formed for example by an oxidation step in which the supply of oxygen is ended at a point in time at which the layer thickness of the gate dielectric attained is still so small that, in the switched-off state of the transistor, majority charge carriers generated thermally in the structure element pass into the word line by direct tunneling.

Further method steps for forming the integrated semiconductor memory are performed in a known manner. Thus, after the patterning of the layer made of semiconductor material to form structure elements, a channel dopant will be introduced, for example by implantation. Before the transistors are produced, firstly trench capacitors are fabricated below the buried insulation layer. A first source/drain region of the selection transistor is electrically connected to a trench capacitor. A bit line contact is formed in a manner adjoining the second source/drain region. The bit line is fabricated above the bit line contact. The result is an integrated semiconductor memory with a multiplicity of memory cells each having a transistor and a storage capacitor. The storage capacitor may also be a stacked capacitor. In this case, the capacitor is fabricated only after the fabrication of the selection transistor.

It is preferably provided that in step c) a second region of the gate dielectric is formed, said second region having a layer thickness greater than the layer thickness of the first region of the gate dielectric. In this case, the gate dielectric is fabricated in two different regions of the surface of the structure element with different magnitude of layer thickness. The first region of the gate dielectric has a smaller layer thickness than the second region. The first region of the gate dielectric is therefore suitable as a high-resistance tunnel contact in the off state of the transistor, whereas the second region is only usable for electrical insulation.

It is preferably provided that prior to forming the gate dielectric, a nitrogen dopant is introduced into a partial region of the structure element. The nitrogen dopant is implanted where the gate dielectric to be grown is intended to have a particularly small layer thickness. The implanted nitrogen locally reduces the growth rate of the dielectric. If, for example, an oxide layer is grown as a gate dielectric by means of an oxidation step, then the nitrogen dopant has the effect that, for the same oxidation time, the layer thickness of the gate dielectric attained is smaller on the first region of the structure element comprising the nitrogen dopant than on the second region, formed without nitrogen dopant.

It is preferably provided that the nitrogen dopant is introduced into a partial region of the structure element which is arranged directly below a top side of the structure element, said top side being opposed to the insulation layer, whereas a region of the structure element which is arranged nearer to the insulation layer is free of a nitrogen dopant. The nitrogen dopant is preferably introduced under the top side of the structure element, said top side being arranged opposed to the insulation layer, where it leads to a locally reduced layer thickness of the gate dielectric. By contrast, a region of the structure element near the bottom side of the structure element, said bottom side forming the interface between the structure element and the insulation layer, is free of a nitrogen dopant.

The structure element is covered from a plurality of sides with an arrangement of layers comprising a gate dielectric and a gate electrode. By way of example, a top side of the structure element, said top side being opposed to the insulation layer, and side faces of the structure element which adjoin the top side are covered with the gate dielectric and the word line. A fully depleted transistor is thereby fabricated, in which the entire region of the structure element is arranged between the first and second source/drain regions. The transistor is depleted of a majority of charge carriers in the switched-on state. In the switched-on state of the transistor, the inversion channel formed of minority charge carriers.

The above and still further aspects, features and advantages of the present invention will become apparent upon consideration of the following detailed description of a specific embodiment thereof, particularly when taken in conjunction with the accompanying drawings wherein like reference numerals in the various figures are utilized to designate like components.

BRIEF DESCRIPTION OF THE DRAWINGS

The invention is described below with reference to the figures, in which.

The following detailed explanations of Figures and of the preferred embodiments reveal the methods and apparatus of the present invention.

DETAILED DESCRIPTION

Figure 1:
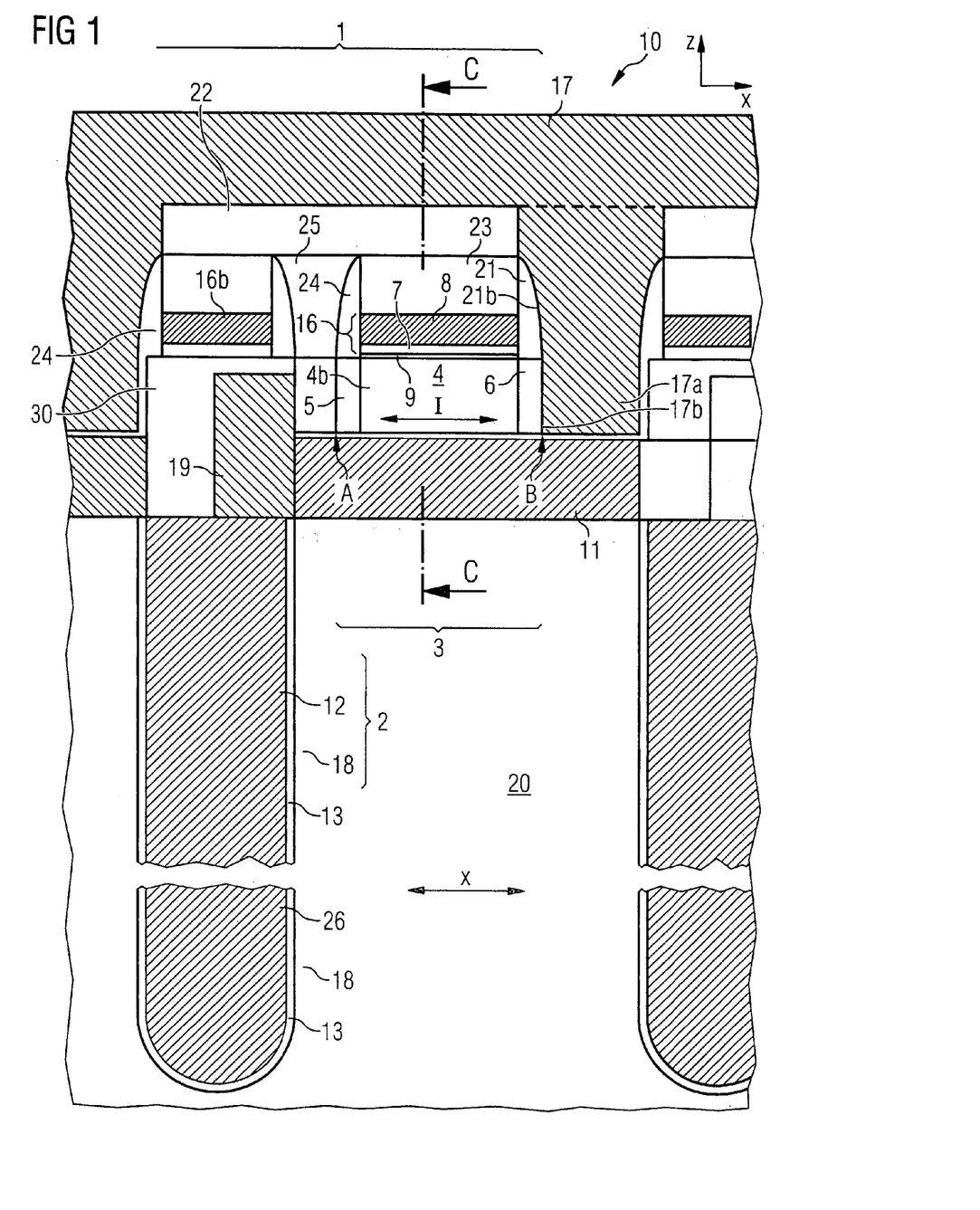
FIG. 1 shows a diagrammatic cross section through a semiconductor memory according to the invention.

FIG. 1 shows an integrated semiconductor memory 10. The SOI semiconductor substrate 20 is an SOI substrate. It comprises a buried insulation layer 11. Structure elements 4 are arranged directly on the insulation layer 11. The selection transistors 3 of the memory cells 1 are arranged above the insulation layer. Each selection transistor 3 has a first 5 and a second source/drain region 6. The first source/drain region 5 is situated at a first lateral end A of the structure element 4. The second source/drain region 6 is arranged at an opposed lateral end B. The structure element extends with its direction of main extension x between said lateral ends A, B. The direction of main extension x coincides with the current flow direction I of the transistor channel. The transistor channel is an inversion channel of minority charge carriers which is formed in the switched-on state (on-state) of the transistor 3. The inversion channel forms if a sufficiently high source-drain voltage is present between the two source/drain regions and an electrical potential which attracts the minority charge carriers of the channel region of the structure element which is present on the word line.

The structure element 4 is preferably formed in parallelepipedal fashion. The structure element 4 has a bottom side forming the interface to the insulation layer 11, a top side 15 opposed to the insulation layer 11, and side faces 14 adjoining the top side 15, the bottom side and the lateral ends A, B. The side faces in particular extend from the insulation layer 11 to the top side 15 of the structure element 4, said top side being opposed to the insulation layer 11. A gate dielectric 9 is arranged on the structure element 4 and a word line 16 is arranged on the gate dielectric 9. The gate dielectric 9 and the word line 16 are layers of an arrangement of layers which covers both the top side 15 of the structure element 4 and the side faces 14 thereof adjoining the top side 15. The outer surfaces of the structure element need not be continued by edges, but rather may also merge with one another through rounded portions. By way of example, the side faces 14 and the top side 15 of the structure element 4 may be connected to form a single curved outer surface. An inner side of the gate dielectric 9 is lying on the top side 15 and on the side faces 14 of the structure element 4. An outer side of the gate dielectric 9 is arranged opposed to the inner side of the gate dielectric. Both at the top side 15 and at the side faces 14 of the structure element 4, the word line 16 is lying on the outer side of the gate dielectric 9 and is at a distance from the structure element 4 which corresponds to the local layer thickness d or D of the gate dielectric 9.

The insulation layer 11 preferably is an oxide layer. Storage capacitors 2 are embedded in the semiconductor substrate 20 below the insulation layer 11. The trenches in which the storage capacitors 2 are arranged also extend through the insulation layer 11.

In contrast to conventional storage capacitors, the storage capacitor 2 does not have a collar region. Instead, at the bottom side of the insulation layer 11, the capacitor dielectric 13 is in contact with the outer capacitor electrode 18 and the inner capacitor electrode 12. The two capacitor electrodes are thus arranged at a distance from one another which corresponds to the layer thickness of the capacitor dielectric. Said capacitor dielectric 13 extends from the bottom 26 of the storage capacitor 2 up to the insulation layer 11 and has the same layer thickness everywhere.

The outer capacitor electrode 18 may be electrically coupled by a buried electrode (buried plate) arranged in the bulk material remote from the buried insulation layer 11. As an alternative to this, the entire substrate material is heavily doped, for instance heavily n-doped, and forms the outer capacitor electrodes 18 of all the storage capacitors. The capacitor dielectric 13 may have one or else a plurality of layers. The electrical connection between the inner capacitor electrode 12 and the first source/drain region 5 of the selection transistor 3 is formed by a contact 19.

The contact 19 and the selection transistor 3 are insulated from the semiconductor material of the semiconductor substrate 20 by the buried insulation layer 11, so that leakage currents, in so far as they occur at all, are smaller in this region than in case of conventional semiconductor memories. The insulation layer 11 has openings in which the material of the insulation layer 11 is removed. The contacts 19 are arranged in the openings. They respectively correct a storage capacitor 2 to a selection transistor. Each contact 19 has a top side arranged deeper than the top side 15 of the structure element 4. The top side of the contact 19 is covered with an insulating filling structure 30 composed of an oxide, for example. The filling structure 30 insulates the contact 19 from a passing word line 16b.

It is preferably provided that a spacer 21 is arranged beside the word line, said spacer having an outer surface 21b arranged flush with a lateral end B of the structure element 4. The spacer 21 covers a side wall of the word line 16 and has an outer surface 16 opposed to the side wall 16, and also a bottom side extending from the side wall of the word line 16 to the outer surface 21b of the spacer. The bottom side of the spacer 21 is arranged on the structure element 4. A lower region of the outer surface 21b of the spacer 21 is arranged flush with the lateral end B of the structure element 4 in the lateral direction, i.e. in the direction of main extension x of the structure element 4. The lower region of the outer surface 21b of the spacer 21 has the same lateral position in the x-direction as the lateral end B of the structure element 4.

Figure 2:
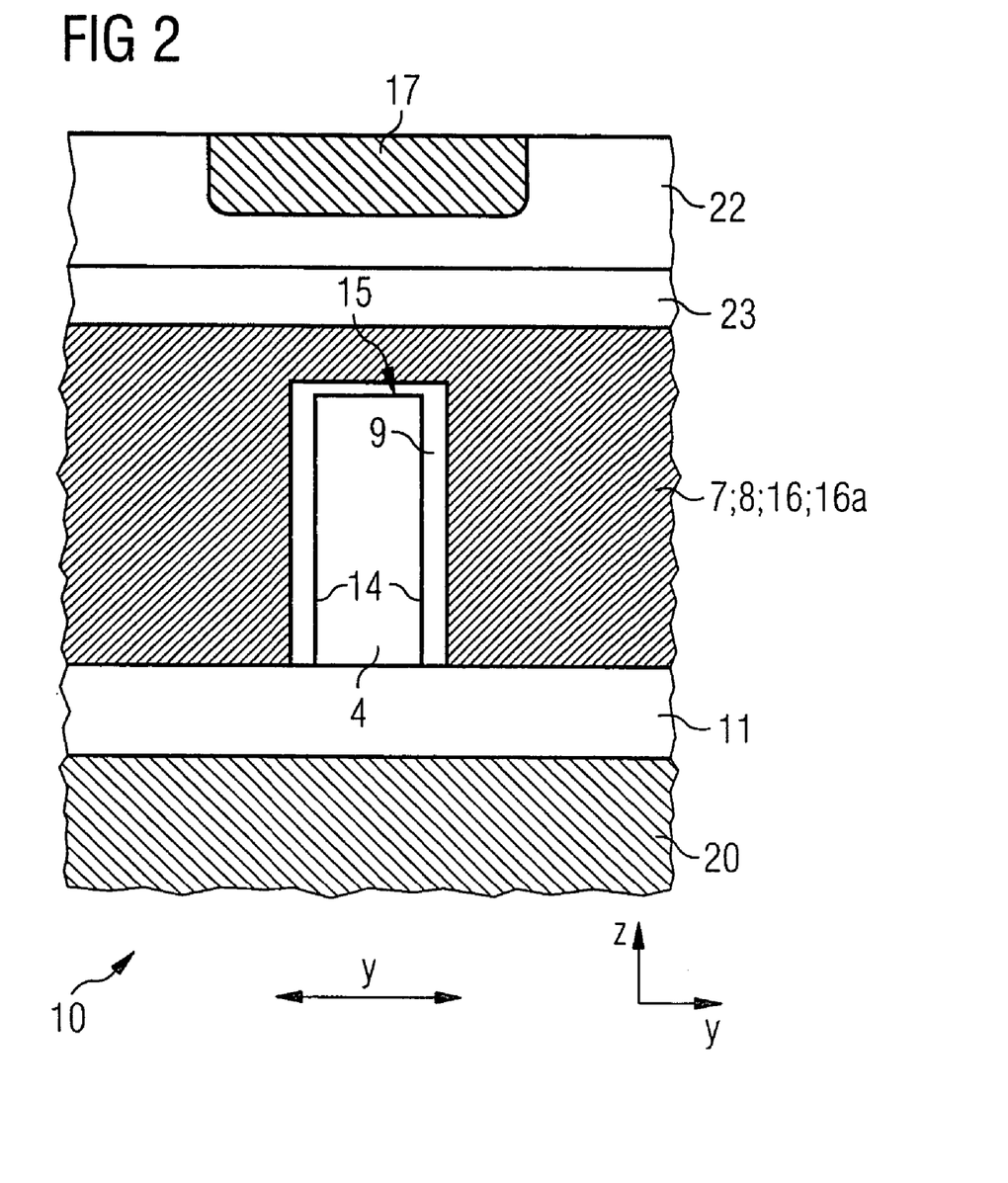
FIG. 2 shows a further diagrammatic cross section along the line C—C in FIG. 1.

FIG. 2 shows a cross-section through FIG. 1 long the line C—C, i.e. perpendicular to the plane of the drawing of FIG. 1. In FIG. 2, the direction of main extension x of the structure element 4 runs perpendicular to the plane of the drawing. The top side 15 and side faces 14 of the structure element 4 which adjoin the top side are covered by an arrangement of layers comprising a gate dielectric 9, a first, lower gate layer 7 and a second, upper gate layer 8. The first gate layer 7 comprises polysilicon, for example, and the second gate layer contains tungsten, for example. The gate electrode is formed by the first and the second gate layer and is isolated from the structure element 4 by the gate dielectric 9.

The dimensions in FIG. 2 are not illustrated to scale. The height of the structure element is preferably greater than the lithographic resolution limit used in the course of exposure during the production of the semiconductor memory. In particular, the height of the structure element and thus the height of the side faces 14 may be greater than the distance of the side faces 14 from one another. The greater the height of the structure element 4, the greater the effective channel width of the transistor channel. In FIG. 2, the insulation layer 11 is arranged below the structure element and the bulk material of the substrate 20 is arranged below the insulation layer 11. Below the insulation layer 11, the substrate 20 is doped, preferably heavily n-doped. Between the source/drain regions 5, 6, the structure element 4 has a dopant adapted to the desired electrical properties of the selection transistor. In particular, the semiconductor material of the structure element 4 may be doped a different dopant, for instance with a dopant of a different charge carrier type, and/or a different dopant concentration than the semiconductor material 20 below the buried oxide layer 11. The bit line 17 is insulated from the word line 16 by an oxide layer 22 or by another dielectric in FIG. 2.

Figure 3:
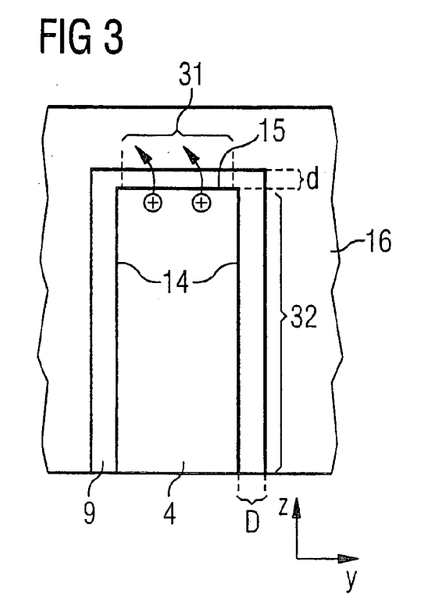
FIG. 3 shows a detail view from FIG. 2.

FIG. 3 shows an enlarged detail view from FIG. 2, illustrating the structure element 4, the gate dielectric 9 and the gate electrode 16, which forms a portion of the word line 16. On the side walls 14 of the structure element, the gate dielectric 9 has a layer thickness D, which prevents charge carriers from tunneling from the structure element 4 into the word line 16. On the top side 15 of the structure element 4, however, the gate dielectric 9 has a layer thickness d of less than 3 nm, so that tunneling (for example of holes in case of an p-doped structure element) is possible there. Majority charge carriers generated thermally in the structure element 4 can leave the semiconductor material of the structure element 4 through the thin gate dielectric 9 on the top side 15 of the structure element 4 and are conducted away through the word line. Therefore, a substrate contact is no longer necessary.

Figure 4:
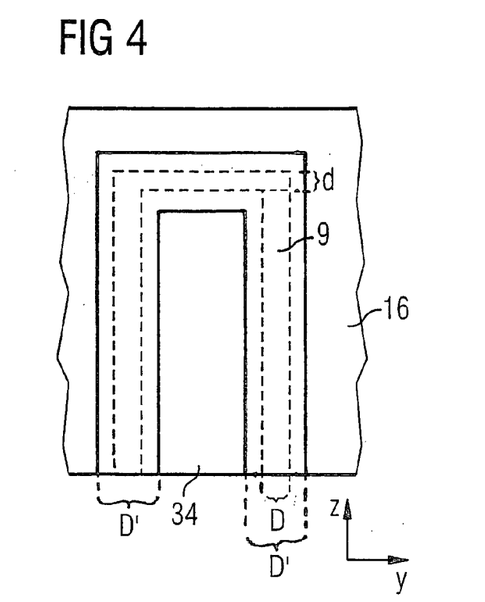
FIG. 4 shows a further detail view from FIG. 2.

FIG. 4 shows a cross-sectional view through the end of the structure element at which the gate dielectric 9 is formed as a bird's beak of increased layer thickness D'. The smaller, mutually different layer thicknesses of the gate dielectric 9 below the plane of the drawing (d on the top side of the structure element 4 and D on the side faces of the structure element) are indicated by broken lines. In FIG. 4, the inversion channel 34 extends over the entire cross section of the structure element in the on-state of the transistor, since the arrangement of layers comprising the gate dielectric 9 and the gate electrode covers more than one face of the structure element. The memory cell can therefore be read and reprogrammed particularly rapidly.

Figure 5:
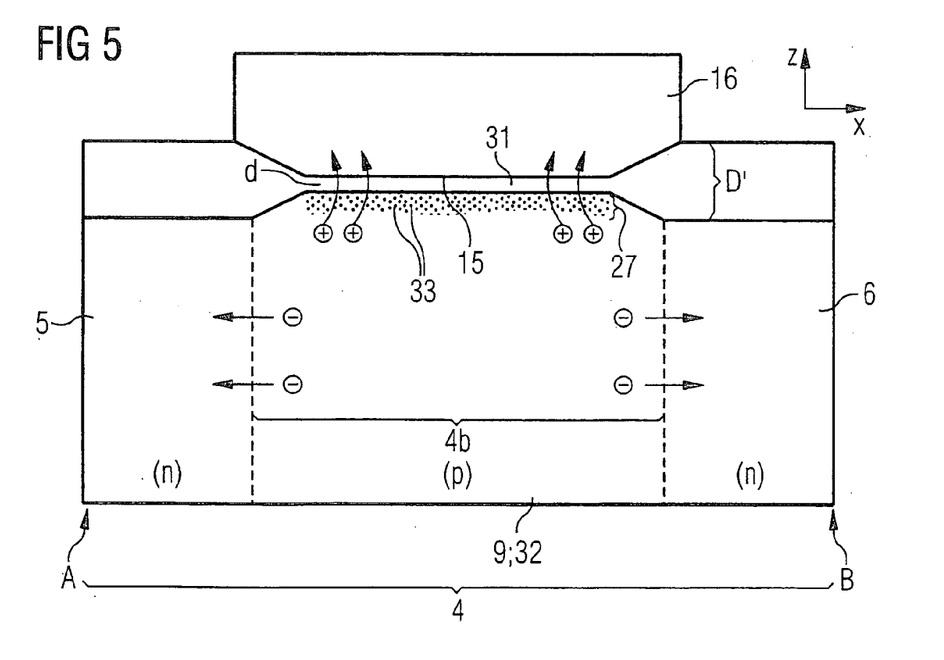
FIG. 5 shows a cross-sectional view along the direction of main extension of the structure element in accordance with FIG. 4.

FIG. 5 shows a cross-sectional view along the direction of main extension x of the structure element 4. The illustration shows the structure element 4, at whose lateral ends A, B the source/drain regions 5, 6 are introduced into the structure element 4. The structure element 4 is covered with the gate dielectric 9. At the ends A and B of the structure element, the gate dielectric 9 has the layer thickness D' (bird's beak). On the top side 15 of the structure element 4, a first region 31 of the gate dielectric 9, which first region has a layer thickness d of less than 3 nm, is arranged in the direction of main extension x between the source/drain regions 5, 6. Majority charge carriers which are generated thermally in the switched-off state of the transistor can tunnel through the first region 31 of the gate dielectric 9. They leave that region 4b of the structure element which is arranged between the source/drain regions 5, 6, by means of direct tunneling through the first region 31 of the gate dielectric 9, and are conducted away through into the word line 16. In terms of production engineering, the first region 31 having a reduced layer thickness d can be fabricated by means of a nitrogen dopant. The bird's beak is produced after the gate patterning by means of an oxidation step.

If, as illustrated in FIG. 5, the selection transistor is an n-MOSFET, the electrons of thermally generated electron-hole pairs can migrate from the region 4b into the n-doped source/drain regions 5, 6. The holes cannot do this owing to their opposite charge. However, they can leave the region 4b of the structure element 4 by means of direct tunneling through the first region 31 of the gate dielectric 9. They thus pass into the word line.

Figure 6:
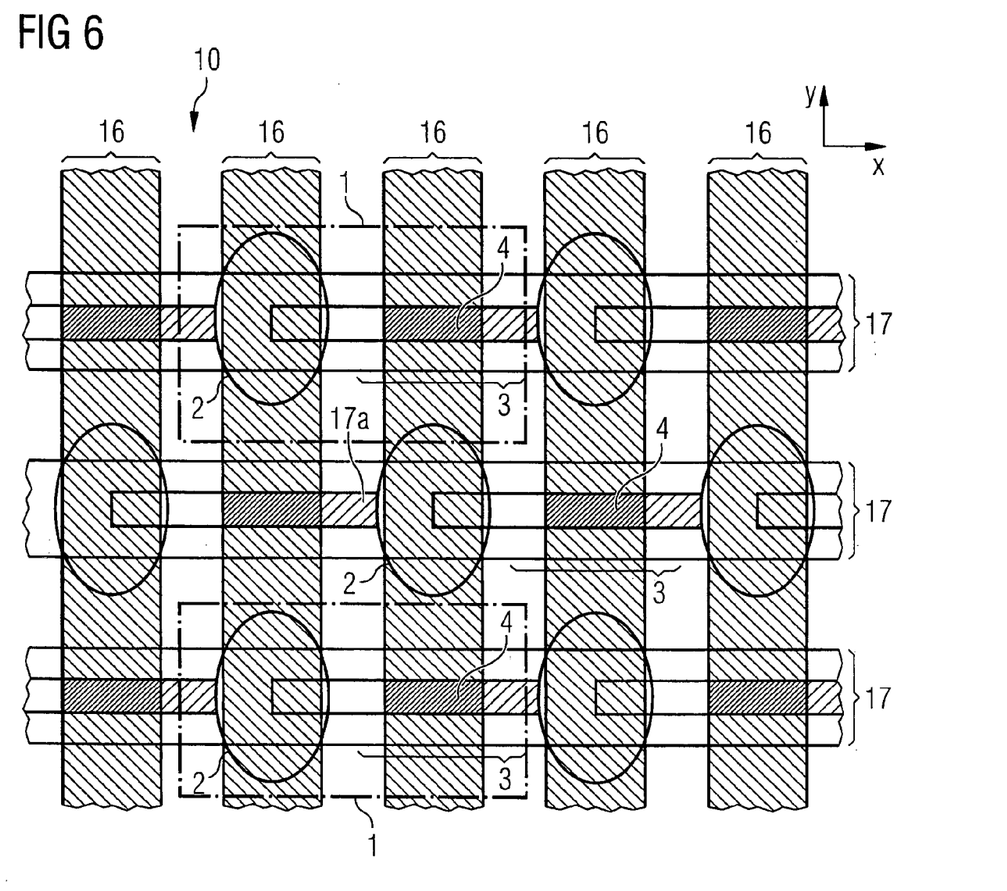
FIG. 6 shows a diagrammatic top view on the semiconductor memory of FIGS. 1 and 2, and FIGS. 7 to 12 show a diagrammatic sequence of a method according to the invention.
Figure 7:
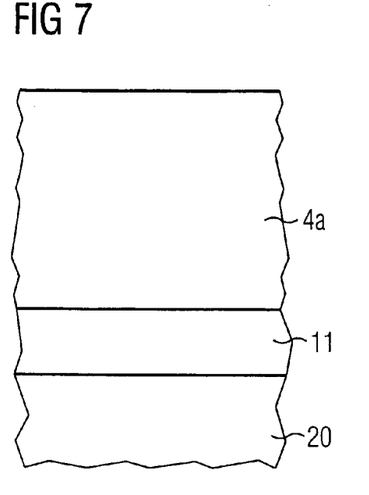

FIG. 6 shows a plan view of an arrangement of seven storage capacitors 2 which, in FIG. 6, are connected to a selection transistor 3 on their right-hand side. The storage capacitors 2 are arranged below the buried insulation layer 11, whereas the selection transistors 3 are arranged above the buried insulation layer 11. Each of the word lines 16 crosses the main direction of extent x of a structure element 4 and surrounds the structure element 4 preferably on a plurality of sides. The word line 16 in particular surrounds a plurality of side faces 14 and also a top side 15 arranged between the side faces. As a result, not only is a large channel width obtained; by means of ridges 4 which may be configured narrower in direction y, with the aid of spacers, than the distance between the bit lines 17, a complete depletion of charge carriers is achieved in the semiconductor material of the structure element, and thus a nearly ideal on/off current characteristic of the selection transistor 3 is achieved. The sub-threshold slope of the operating characteristic curves of such a transistor is significantly higher than in case of a conventional transistor; a significantly higher current is achieved with a significantly reduced voltage swing at the gate. This affords advantages over conventional memory cell types, for instance a higher current conducting capacity and a smaller area taken up by the circuits.

In FIG. 6, the structure elements 4 are arranged in rows along the bit lines 17 running above them. The direction of main extension x is the same as the direction in which the bit lines 17 run. Memory cells 1 which are connected to bit lines 17 that are the nearest adjacent to one another are arranged offset with respect to one another in the x direction. They are driven by two different word lines 16. Each word line 16 runs in the y direction alternately over a structure element 4 of one memory cell and over a storage capacitor 2 of a respective further memory cell. A plurality of memory cells 1 are connected to each word line.

In order to fabricate the semiconductor memory according to the invention, use is made of an SOI substrate, for example, which is doped below its oxide layer 11. The substrate is covered with a layer sequence which serves as an etching mask for the patterning of capacitor trenches. The layer sequence may contain an oxide layer, a nitride layer, a layer made of borosilicate glass as well as a polysilicon layer. The photolithographic patterning of the mask is followed by the etching of the capacitor trenches. This is followed by deposition of the capacitor dielectric (for instance a nitride, oxide, aluminum oxide, etc.) and, on the latter, the inner capacitor electrode. The inner capacitor electrode may comprise heavily n-doped polysilicon. The material of the inner capacitor electrode is etched back at most to the lower edge of the buried insulation layer 11 of the semiconductor substrate 20. The material of the inner capacitor electrode which has not been etched back and remains in the trench completely fills the region of the trench below the insulation layer. The capacitor dielectric 13 is then removed at the level of the structure element, a polysilicon layer is deposited and subsequently etched back approximately to the level of the top side of the structure element 4 or a little deeper. Half of each contact 19 is removed, so that a contact having a semicircular basic area is produced from a contact having an originally circular basic area. The etched semicircular opening beside the semicircular contact is filled with an insulating material, for instance an oxide 30. The insulating material is also applied to the top side of the contact 19. Afterward, a hard mask for patterning the structure elements is patterned lithographically. In order to fabricate particularly fine hard mask structures for patterning the structure elements, it is also possible to use a spacer as a mask. As a result, it is possible to achieve widths of the structure elements in the y direction which are smaller than the lithographic resolution limit used for the patterning of word lines. After the etching of the surroundings of the structure elements, the spacers used as an etching mask are removed and a dopant for a channel region is introduced, for instance, by means of an implantation, into the semiconductor material of the structure element. The gate dielectric is then fabricated. In order, however, to obtain a gate dielectric having a first region with a smaller layer thickness and a second region with a larger layer thickness, firstly a nitrogen dopant 33 is introduced closely under the top side 15 of the structure element 4, said top side being opposed to the insulation layer 11. The nitrogen dopant 33 reduces the growth rate of the gate dielectric 9 on the surface of the structure element 4 during the subsequent oxidation step. In this way, the first region 31 of the gate dielectric 9, the layer thickness d of which is less than 3 nm, is produced on that region of the surface of the structure element 4 into which the nitrogen dopant 33 has been introduced. The second region 32 of the gate dielectric 9, which has a layer thickness D of more than 3 nm, is produced on the remaining surface of the structure element 4. During operation of the semiconductor memory, the first region 31 of the gate dielectric 9 constitutes a high-resistance tunnel contact through which majority charge carriers generated thermally in the structure element 4 flow away into the word line.

Polysilicon is deposited as first gate layer 7 onto the gate dielectric 9 and is subjected to chemical mechanical polishing. A second gate layer 8 made of tungsten, for example, is deposited on the first gate layer 7 and a covering layer made of nitride 23 is deposited on said second gate layer. The word line layer stack is subsequently patterned lithographically. This patterning comprises, inter alia, a nitride etching, a resist removal, a tungsten etching, an etching of polysilicon and the subsequent side wall oxidation of the word line. Afterward, a nitride or a different spacer material is deposited and etched back anisotropically, thereby producing spacers 21, 24. Afterward, the first and second source/drain regions are formed and covered by an oxynitride deposition and a deposition of BPSG (borophosphosilicate glass), which is made to flow thermally. After the BPSG filling has been polished back to the top side of the nitride 23 covering the word lines, an undoped oxide is deposited. The oxide is patterned lithographically. Bit line contact holes are then etched for the purpose of making contact with the second source/drain regions 6. The etching comprises an oxide etching, an oxynitride etching and a silicon etching. Finally, a metal is deposited for the purpose of fabricating the bit line contacts and the bit lines themselves. In this way, a selection transistor with a transistor channel having a horizontal current direction is fabricated at each structure element in the memory cell array. The selection transistor, in the on-state, enables a high write and read current to the storage capacitor 2 and, in the off-state, is nevertheless insulated from the material of the semiconductor substrate 20 by the buried insulation layer 11. The integrated semiconductor memory fabricated in this way has trench capacitors 2, whose capacitively effective capacitor areas extend up to the bottom side of the insulation layer. The trench capacitor 2 therefore has a larger capacitance than trench capacitors which have a collar region. The storage capacitor may likewise be a stacked capacitor. In this case, the storage capacitor is arranged above the word lines and there is no electrical connection whatsoever between the substrate material and the memory cell. A memory cell on which the semiconductor memory according to the invention is based, typically has a basic area of 8 F2, where F corresponds to the optical resolution limit or typical structure width of structures produced lithographically.

Figure 8:
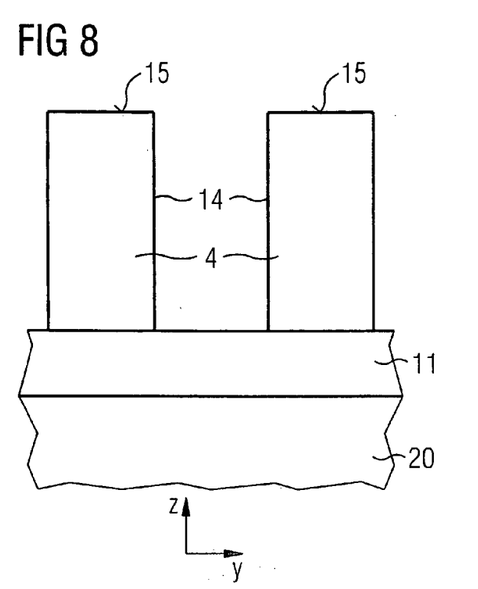
Figure 9:
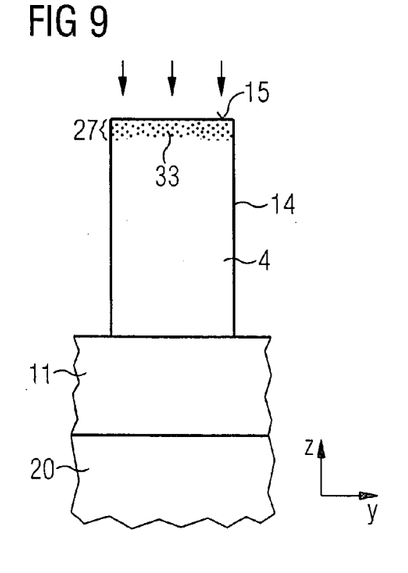

The method steps for forming the structure element 4 and the gate dielectric 9 are described in greater detail below with reference to FIGS. 7 to 12. In accordance with FIG. 7, a semiconductor substrate 20 is provided, having a buried insulation layer 11 and, on the insulation layer 11, a layer 4a made of semiconductor material (SOI substrate; silicon on insulator). The layer 4a made of semiconductor material is subsequently patterned, thereby producing a multiplicity of structure elements 4, for example ridges. In FIG. 8, the ridges are illustrated perpendicular to the direction of the transistor channel. Each structure element 14 has a top side 15, which is opposed to the insulation layer 11 and is adjoined by the side faces of the structure element 4. A first side face is arranged opposed to a second side face. In accordance with FIG. 9, a nitrogen dopant 15 is introduced into a partial region 27 of the structure element 4, namely preferably into a region directly below the top side 15 of the structure element 4. In particular, nitrogen can also be introduced into a smaller partial region 27 of the structure element 4 arranged directly below the top side 15 of the structure element 4.

Figure 10:
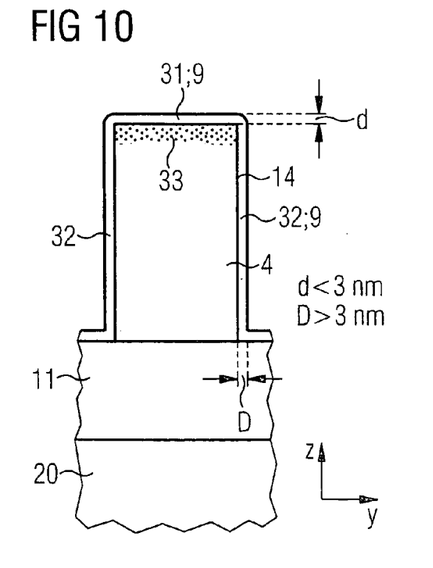

Finally, a gate dielectric is formed on the surface of the structure element 4, as illustrated in FIG. 10. For this purpose, firstly a nitrogen dopant 33 is introduced closely under the top side 15 of the structure element 4. The surface of the structure element 4 is then oxidized. The nitrogen dopant 33 leads to a locally reduced growth rate of the gate dielectric 9 on the top side 15 of the structure element 4. The first region 31 of the gate dielectric 9 is produced there, which first region has a layer thickness of less than 3 nm and can therefore be utilized as a tunnel contact. The layer thickness of the first region 31 of the gate dielectric 9 is so small that, in the switched-off state of the transistor majority charge carriers generated thermally in the structure element 4 pass into the word line 16 by means of direct tunneling through the gate dielectric 9. The layer thickness d of the first region 31 of the gate dielectric is preferably less than 3 nm; it is between 2 and 3 nm, by way of example. The first region 31 is arranged on the top side of the structure element 4. By contrast, a second region 32 of the gate dielectric 9 has a layer thickness D greater than 3 nm. The second region 32 of the gate dielectric 9 serves for electrical insulation, whereas the first region 31 also serves as a high-resistance tunnel contact. The second region 32 is formed at side faces 14 of the structure element 4.

Figures 11, 12:
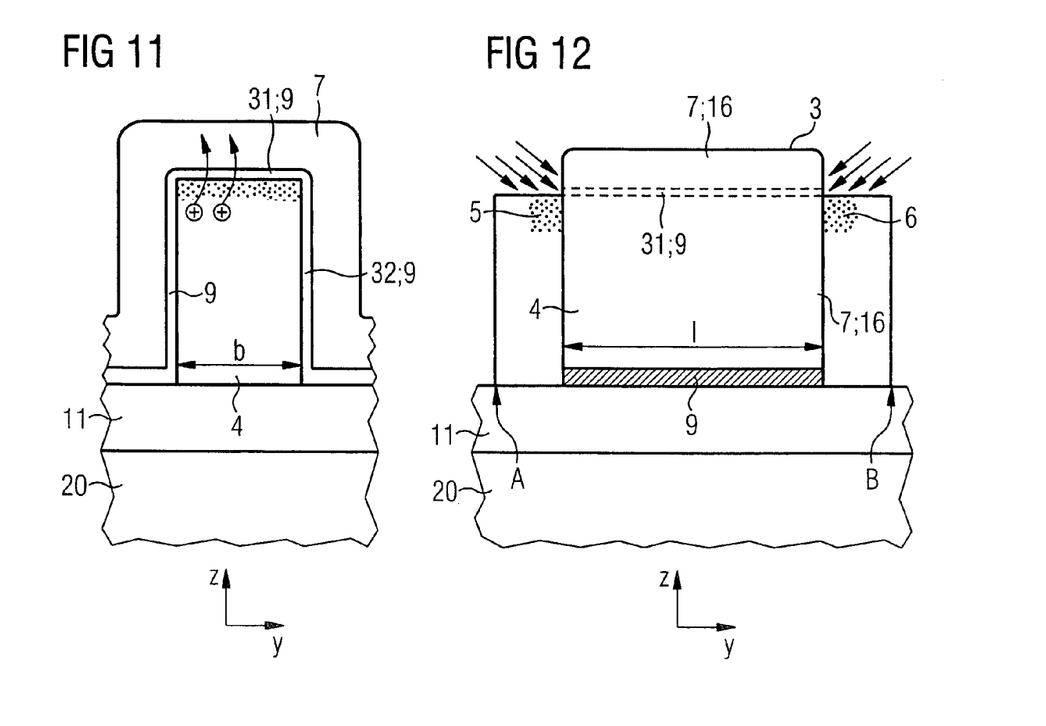

In accordance with FIG. 11, at least one gate layer 7 is deposited, which covers the gate dielectric 9 arranged on the top side and on the adjoining side faces of the structure element 4. FIG. 11 furthermore shows that majority charge carriers (for example holes in the case of a p-doped structure element 4), in the off state of the transistor, tunnel through the first region 31 of the gate dielectric 9 and thereby pass into the word line 16. FIGS. 7 to 11 show a cross-sectional view of the structure element 4 perpendicular to the current flow direction of the transistor channel.

FIG. 12 shows a cross-sectional view parallel to the current flow direction of the transistor channel. In accordance with FIG. 12, a word line 16 is patterned. The word line 16 has at least one gate layer 7. A second gate layer may be provided on the gate layer 7, said second gate layer having a higher electrical conductivity than the gate layer 7. The arrangement of layers comprising the gate dielectric 9 and the word line 16 covers the structure element 4. Source/drain dopants are introduced at opposed ends A, B of the structure element 4, thereby producing a first 5 and a second source/drain region 6.

The length 1 of that region 4b of the structure element 4 which is arranged between the first 5 and the second source/drain region 6 is preferably a factor of at least 2.5 greater than the width b of the structure element 4 as illustrated in FIG. 11, the width being measured in the direction perpendicular to the current flow direction of the transistor channel and parallel to the insulation layer 11. This ensures that the transistor 3 is a fully depleted device, in the case of which the entire structure element 4 between the first source/drain region 5 and the second source/drain region 6 is fully depleted of majority charge carriers in the switched-on state. As a result, high currents are achieved during the storage and read-out of information. In the switched-off state of the transistor, majority charge carriers generated thermally in the structure element 4 are conducted away through the first region 31 of the gate dielectric 9 into the word line 16. In this case, the state of charging of the storage capacitor connected to the first source/drain region 5 is not altered, i.e. this does not give rise to any leakage currents.

The embodiment of a semiconductor memory according to the invention as illustrated in the figures is only by way of example. As an alternative, the semiconductor memory may be for example a memory with a stacked capacitor or a memory without a capacitor, having only transistors. Moreover, any desired semiconductor memory which has a "floating body", i.e. a channel region with a variable electrical potential lacking a substrate connection, may be equipped with a tunnel window according to the invention.

A number of implementations have been described. Nevertheless, it will be understood that various modifications may be made without departing from the spirit and scope. Accordingly, other implementations are within the scope of the following claims.

| List of reference symbols | |
|---|---|
| 1 | memory cell |
| 2 | storage capacitor |
| 3 | transistor |
| 4 | structure element |
| 4a | layer made of semiconductor material |
| 4b | region of the structure element |
| 5 | first source/drain region |
| 6 | second source/drain region |
| 7 | first gate layer |
| 8 | second gate layer |
| 9 | gate dielectric |
| 10 | integrated semiconductor memory |

| -continued | |
|---|---|
| List of reference symbols | |
| 11 | insulation layer |
| 12 | inner capacitor electrode |
| 13 | capacitor dielectric |
| 14 | side face of a structure element |
| 15 | top side of a structure element |
| 16 | word line |
| 16a | gate electrode |
| 16b | further word line |
| 17 | bit line |
| 17a | bit line contact |
| 17b | end face |
| 18 | outer capacitor electrode |
| 19 | contact |
| 20 | semiconductor substrate |
| 21 | spacer |
| 21b | outer surface |
| 22 | oxide layer |
| 23 | nitride layer |
| 24 | further spacer |
| 25 | insulating filling |
| 26 | bottom of the storage capacitor |
| 27 | partial region of the structure element |
| 30 | insulating filling structure |
| 31 | first region |
| 32 | second region |
| 33 | nitrogen dopant |
| 34 | inversion channel |
| A, B | lateral ends of the structure element |
| B | width of the structure element |
| d, D | layer thicknesses |
| l | length of region 4b |
| I | current flow direction of the transistor channel |
| T | time |
| t | point in time |
| x | direction of main extension |
| y, z | directions |

What is claimed is:

1. An integrated semiconductor memory with at least one memory cell including at least one transistor which forms an inversion channel in the switched-on state, the transistor comprising:

a structure element further containing a semiconductor material, the structure element comprising a first source/drain region, a second source/drain region and a region disposed between the first and the second source/drain region, the structure element being insulated from a semiconductor substrate by an insulation layer; and a gate dielectric disposed on the structure element and a word line disposed on the gate dielectric, the gate dielectric comprising a high-resistance tunnel contact including a first region, the layer thickness of which is such that, in the switched-off state of the transistor, majority charge carriers generated thermally in the structure element pass into the word line by direct tunneling through the gate dielectric, and the entire region of the structure element which region is disposed between the first and the second source/drain region being depleted of majority charge carriers in the switched-on state of the transistor.

2. The semiconductor memory as claimed in claim 1, wherein a plurality of memory cells are connected to the word line.

3. The semiconductor memory as claimed in claim 2, wherein the memory cell is a dynamic memory cell and the transistor comprises a selection transistor, and the memory cell has a storage capacitor, which is electrically coupled to the first source/drain region.

4. The semiconductor memory as claimed in claim 3, wherein the storage capacitor is comprises a trench capacitor including an inner capacitor electrode, an outer capacitor electrode and a capacitor dielectric, and, on the bottom side of the insulation layer, the distance between the inner capacitor electrode and the outer capacitor electrode is of exactly the same magnitude as at a bottom of the trench capacitor.

5. The semiconductor memory as claimed in claim 4, wherein the inner capacitor electrode extends to the bottom side of the insulation layer and is coupled by a contact to the first source/drain region of the selection transistor.

6. The semiconductor memory as claimed in claim 5, wherein a top side of the contact, said top side being disposed on the same side of the insulation layer as the structure element, is arranged nearer to the insulation layer than the top side of the structure element, and the contact is insulated from a further word line by an insulating upper filling structure.

7. The semiconductor memory as claimed in claim 1, wherein the structure element is disposed on an insulation layer, the first source/drain region is arranged in the structure element at one lateral end of the structure element and the second source/drain region is arranged in the structure element at another lateral end in the structure element, and between the two ends of the structure element, a top side of the structure element, said top side being opposed to the insulation layer, and side faces of the structure element which adjoin the top side are covered with an arrangement of layers comprising a gate dielectric and a gate electrode.

8. The semiconductor memory as claimed in claim 7, wherein the arrangement of layers having the gate dielectric and the gate electrode covers the top side of the structure element, said top side being opposed to the insulation layer, and the side faces of the structure element which adjoin the top side.

9. The semiconductor memory as claimed in claim 1, wherein the gate dielectric has a second region, which has a layer thickness greater than the layer thickness of the first region.

10. The semiconductor memory as claimed in claim 9, wherein the first region of the gate dielectric is arranged on the top side of the structure element, said top side being opposed to the insulation layer, and the second region comprises the side faces of the structure element.

11. The semiconductor memory as claimed in claim 1, wherein a nitrogen dopant is introduced into the structure element adjoining the first region of the gate dielectric.

12. The semiconductor memory as claimed in claim 1, wherein the gate dielectric has a layer thickness of less than approximately 3 nm.

13. The semiconductor memory as claimed in claim 1, wherein the semiconductor substrate is doped below the insulation layer.

14. The semiconductor memory as claimed in claim 1, wherein a bit line contact is in contact with an end face of the structure element.

15. The semiconductor memory as claimed in claim 1, wherein a spacer is arranged beside the word line, said spacer having an outer surface arranged flush with a lateral end of the structure element.

16. The semiconductor memory as claimed in claim 1, wherein a bit line is arranged above the structure element, wherein the bit line runs in the direction of main extension of the structure element and is connected to the second source/drain region.

17. The semiconductor memory as claimed in claim 1, wherein the semiconductor memory has a multiplicity of memory cells comprising transistors, a bit line contact being arranged at approximately every second crossover between a bit line and a word line and a word line passing above or below a storage capacitor at the remaining crossovers.

18. The semiconductor memory as claimed in claim 1, wherein the structure element is formed in parallelepipedal fashion.

19. The semiconductor memory as claimed in claim 1, wherein the gate dielectric has layer thickness between approximately 2 and 3 nm. in the first region.

* * * * *